United States Patent
Fery

(10) Patent No.: US 7,986,091 B2
(45) Date of Patent: Jul. 26, 2011

(54) ORGANIC LIGHT EMITTING DIODE HAVING A RESONANT OPTICAL CAVITY AND AN EXTRACTOR SERVING AS A SPATIAL LIGHT FILTER

(75) Inventor: Christophe Fery, Niedererschach (DE)

(73) Assignee: Thomson Licensing, Boulogne-Billancourt (FR)

( * ) Notice: Subject to any disclaimer, the term of this patent is extended or adjusted under 35 U.S.C. 154(b) by 137 days.

(21) Appl. No.: 12/084,496

(22) PCT Filed: Oct. 31, 2006

(86) PCT No.: PCT/EP2006/067978
§ 371 (c)(1),
(2), (4) Date: Mar. 3, 2009

(87) PCT Pub. No.: WO2007/051799
PCT Pub. Date: May 10, 2007

(65) Prior Publication Data
US 2009/0302741 A1    Dec. 10, 2009

(30) Foreign Application Priority Data
Nov. 4, 2005 (FR) .................... 05 53343

(51) Int. Cl.
*H01L 51/50* (2006.01)
(52) U.S. Cl. ...................... 313/504; 313/112
(58) Field of Classification Search .............. 313/504
See application file for complete search history.

(56) References Cited

U.S. PATENT DOCUMENTS

| | | | |
|---|---|---|---|
| 2003/0034938 A1 | 2/2003 | Yamada | |
| 2003/0164679 A1* | 9/2003 | Hamano et al. | 313/504 |
| 2004/0051447 A1 | 3/2004 | Okinaka et al. | |
| 2004/0150329 A1 | 8/2004 | Asai et al. | |
| 2005/0140277 A1* | 6/2005 | Suzuki et al. | 313/504 |
| 2005/0224826 A1* | 10/2005 | Keuper et al. | 257/98 |

FOREIGN PATENT DOCUMENTS
EP           0801429       10/1997
WO    WO 2005/098987     10/2005

OTHER PUBLICATIONS
Search Report Dated Jan. 22, 2007.

* cited by examiner

*Primary Examiner* — Bumsuk Won
*Assistant Examiner* — Andrew J Coughlin
(74) *Attorney, Agent, or Firm* — Robert D. Shedd; Jeffrey M. Navon

(57) ABSTRACT

According to the invention, the extractor is a reflection concentrator. The entry section of the extractor has a larger area than its exit section. The reflecting side walls of the extractor have a suitable shape so that it makes an angle called the cut-off angle $\theta_{lim}$, which corresponds to a limiting wavelength $\lambda_{C\text{-}lim}$ for transmission from this extractor for a given optical cavity. Applied to diode-based image displays, the invention broadens the viewing angles and improves the colour purity of the images displayed.

12 Claims, 6 Drawing Sheets

ORGANIC LIGHT EMITTING DIODE HAVING A RESONANT OPTICAL CAVITY AND AN EXTRACTOR SERVING AS A SPATIAL LIGHT FILTER

This application claims the benefit, under 35 U.S.C. §365 of International Application PCT/EP2006/067978, filed Oct. 31, 2006, which was published in accordance with PCT Article 21(2) on May 10, 2007 in French and which claims the benefit of French patent application No. 0553343, filed Nov. 4, 2005.

The invention relates to a diode comprising an organic electroluminescent layer inserted between a lower electrode and an upper electrode, and between a lower reflecting layer and an upper reflecting layer, forming between them a resonant optical cavity in a direction normal to said layers for a range of wavelengths of light that can be emitted by said electroluminescent layer, at least one of the electrodes and the reflecting layer located on the same side as this electrode relative to said electroluminescent layer being transparent or semi-transparent to said light emitted by the diode. The invention also relates to an image display comprising a plurality of such diodes.

Document US 2004-051447 discloses diodes of this type, in which one of the reflecting layers serves as electrode, where the other electrode is transparent and positioned on the same side, relative to the electroluminescent layer, as the other reflecting layer, which is semi-transparent and formed from a reflecting stack of dielectric sublayers.

When an electrical current is passed between the electrodes of such a diode, some of the light that is emitted by the electroluminescent layer resonates in the optical cavity and leaves the diode through the transparent electrode and the reflecting dielectric layer, with an emission maximum intensity in a direction normal to the plane of this layer.

FIG. 1 illustrates the distribution of the emission intensity of a diode of this type with respect to the viewing angle (or the angle of emission), measured relative to the direction normal to this diode. The diode considered here has the following structure: substrate/Ag (reflective opaque lower metal electrode)/organic layers (including the electroluminescent layer)/Ag (2 nm or 20 nm thick)/ZnSe, in which the ZnSe dielectric layer is adapted so as to obtain the minimum absorption of the Ag/ZnSe stack. The ZnSe dielectric layer may also be adapted so as to optimize the optical properties of the Ag/ZnSe stack, as described in documents EP 1 076 368, EP 1 439 589 and EP 1 443 572. FIG. 1 therefore shows that, whatever the thickness of the Ag upper electrode (2 nm or 20 nm), the spatial distribution of the emission from a light-emitting diode is much narrower and directional than a Lambertian source (dashed curve).

Document U.S. Pat. No. 6,326,224 teaches the purification of the colours that a resonant optical cavity incorporated into a diode makes it possible to achieve. There may even be several cavities (or microcavities), as illustrated in document U.S. Pat. No. 5,949,187.

Moreover, the optical cavity causes a variation, with wavelength, of the angular distribution of the emission, as illustrated in FIG. 7 of the abovementioned document US 2004-051447, repeated here as FIG. 2. This figure shows the angular position (on the x-axis) of the emission maximum as a function of the emitted wavelength. The wavelength for which the emission maximum is oriented perpendicular to the diode (viewing angle=0°) corresponds to the resonant wavelength of the cavity in a normal direction. Documents EP 0 801 429, US 2003/034938 and WO 2005/098987 also disclose these variations in the angular distribution of the emission as a function of the characteristics of the optical resonant cavity.

FIG. 4 gives the angular distribution of the emission from an organic diode emitting in the red and having the following structure: substrate/Al (reflecting opaque lower electrode)/organic layers (including the electroluminescent layer)/Ag (20 nm)/ZnSe(85 nm). This distribution is given for three different wavelengths of the fluorescence spectrum of the same electroluminescent layer, namely 650 nm (solid curve), 630 nm (dashed curve) and 615 nm (dotted curve). From this FIG. 4 it is possible to deduce, as already illustrated by FIG. 2, the variation in the angular position of the emission maximum as a function of the emitted wavelength (here, only three wavelengths are shown). FIG. 3 gives the intrinsic spectral emission distribution of the material of the electroluminescent layer.

Because of this variation in the angular position of the emission maximum as a function of the emitted wavelength, an observer placed in front of the diode will therefore perceive emitted shades of colour that differ according to the viewing angle of this diode that will be chosen.

To solve this colour purity problem, document US 2004-051447 proposes adding to the diode a light extraction device comprising a convergent lens and a mask provided with an aperture forming a stop for this lens. The stop must be positioned on the optical axis of the lens so as to let through only the rays emitted by the diode in a direction close to the normal to this diode (zero viewing angle) and in blocking the rays emitted at a viewing angle greater than a "cut-off angle", this stop being positioned approximately in the focal plane of the lens. The cut-off angle is proportional to the aperture of the stop and inversely proportional to the distance between the lens and the stop, which in general corresponds to the focal length of the lens. By eliminating a high proportion of rays whose emission intensity is a maximum for an angle of emission greater than the cut-off angle, the extraction device proposed in said document substantially improves the emission colour purity of the diode.

One drawback of the diodes described in document US 2004-051447 lies in the constraints on positioning the components of the extraction device. Another drawback is that the emission from these diodes retains a very pronounced directionality, the spatial distribution of the emission remaining much narrower than that of a Lambertian source. Another drawback of the extraction device described in document US 2004-051447, at least when the diodes are in an array in order to form an image display, is that it is necessary to position a lens over each diode, thereby introducing alignment constraints that greatly penalize the manufacture of the display.

An object of the invention is to solve one or more of the aforementioned drawbacks.

For this purpose, one subject of the invention is a diode comprising an organic electroluminescent layer inserted between a lower electrode and an upper electrode, and between a lower reflecting layer and an upper reflecting layer, forming between them a resonant optical cavity for a range of wavelengths of light that can be emitted by said electroluminescent layer, at least one of the electrodes and the reflecting layer located on the same side as this electrode relative to said electroluminescent layer being transparent or semi-transparent to said emitted light, this diode including at least one light extractor comprising a light entry section, optically coupled to said electroluminescent layer via said electrode and said reflecting layer that are transparent or semi-transparent, a light exit section, which is oriented towards the outside of the diode and has a smaller area than that of the entry section, and reflecting side walls, which are bounded by said entry section and by said exit section.

The lower reflecting layer and the upper reflecting layer are generally parallel. The reflecting layer that is semi-transparent is therefore here semi-reflective.

Preferably, the electrodes also serve as reflecting layers for defining the optical cavity. One of the electrodes is, for example, formed from a thick reflective opaque metal layer, for example an aluminium or silver layer. The other electrode may be formed from a metal sublayer thin enough to be both reflective and semi-transparent, for example a 20 nm silver layer, and from a transparent dielectric sublayer, for example made of ZnSe, adapted, in terms of nature and thickness, so as to optimize the optical properties of this electrode. The distance $D_C$ between the electrodes then corresponds to the height of the resonant cavity. As document US 2003-034938 teaches, the resonance condition in this cavity is expressed by the equation: $2\pi \times 2D_C/\lambda_{CN} + F = 2\pi m$, where m is an integer, in general equal to 1, and where F denotes the overall phase change upon reflection of a ray of wavelength $\lambda_{CN}$ of each of the reflecting layers that delimit the resonant cavity. The above equation gives the resonant wavelength $\lambda_{CN}$ for a propagation direction of the rays that is normal to the reflecting layers that define the resonant cavity. For propagation directions moving away from the normal, the resonant wavelength decreases, as FIGS. 2 and 4 illustrate.

In FIG. 4, the resonant wavelength in a normal direction is $\lambda_{CN}$=650 nm (solid curve). The dashed curve (630 nm) and the dotted curve (615 nm) show that the intensity of the light emanating from the diode in a normal direction remains substantial even when far from the normal resonant wavelength $\lambda_{CN}$: there therefore exists a wavelength range of the light emitted by the diode which therefore corresponds to the normal emission direction.

The entry and exit sections of the extractor are generally plane and parallel to the reflecting layers of the diode, and therefore perpendicular to the normal emission direction.

Since the extractor has an exit section whose area is smaller than that of the entry section, this extractor operates as a concentrator. Since it has reflecting side walls, this extractor operates as a concentrator by reflection. The rays that leave the extractor have passed through it either directly without being reflected or, on the contrary, after one or more reflections off the side walls.

This extractor therefore operates by reflection and not by refraction as in document US 2004-150329, in which the side walls are refracting (and not reflecting as in the invention), this refraction being intended to redirect the emitted light into a direction approaching the normal direction.

All the side walls of the extractor are not necessarily reflecting. In the case of a display comprising diodes distributed in rows and/or columns, each extractor may be common to all the diodes of any one row or of any one column. This extractor then comprises two opposed reflecting side walls, the other two side walls of this extractor being shifted to the ends of the row or of the column, and not necessarily being reflecting. The entry section of the extractor is then optically coupled to a plurality of diodes. In this configuration, each diode of the row "sees" only two portions of opposed reflecting walls of the extractor.

The diode may also include several juxtaposed extractors so that the entry sections of these extractors cover the entire emissive surface of the diode. The emissive surface is then coupled to several extractor entry sections. Even in such a case, these extractors may also be common to several diodes.

Preferably, to obtain the concentration effect, the reflecting side walls of the at least one extractor of the diode are turned towards its entry section. This means that the normal at any point on said reflecting walls cuts this entry section by passing via the interior of the extractor or, otherwise, is parallel to this entry section.

Preferably, the reflecting side walls of the at least one extractor have a suitable shape so that any emitted light ray that penetrates via its entry section, which is reflected at least once by said side walls, and which emerges from the extractor via its exit section, emerges therefrom at an angle of emission greater than the angle of emission of this ray at the entry of the extractor.

Thus, the angular distribution of the emission intensity is broadened and advantageously approaches a Lambertian distribution. It should be noted that this effect is exactly opposite, when using similar reflectors, to that provided by the optical systems described in Document U.S. Pat. No. 6,603,243 (see column 11, paragraph 1 and FIG. 17) since, in that document, the aim is to limit the vertical field of observation, contrary to the invention in which the aim is to broaden the field of observation (especially the horizontal field).

The definition of the shape of the reflecting side walls includes that of the depth of the extractors, that is to say the distance between the entry section and the exit section. It also includes the shape and the area of these sections whose edges define these walls.

Preferably, the reflecting side walls of the at least one extractor have a suitable shape so that there is an angle called the cut-off angle $\theta_{lim}$ such that:

the emitted light rays, which penetrate via its entry section at an angle of emission not exceeding said cut-off angle $\theta_{lim}$, emerge from this extractor via its exit section, said angle of emission being measured relative to a direction normal to said lower reflecting layer and to said upper reflecting layer; and the emitted light rays, that penetrate via its entry section at an angle of emission greater than this cut-off angle $\theta_{lim}$, do not emerge from the extractor via its exit section.

In practice, the cut-off angle is not an absolute angle in the sense that there may exist several rays which, although having an angle of emission slightly greater than the cut-off angle, nevertheless emerge from the extractor via its exit section, and there exist several rays which, although having an angle of emission slightly less than the cut-off angle, do not however emerge from the extractor via its exit section.

Referring to FIG. 4, the extractor of the diode according to the invention therefore eliminates a large proportion of emitted light rays having a wavelength whose emission intensity is a maximum for an angle of emission greater than the cut-off angle $\theta_{lim}$. By suitably choosing the value of this angle, and therefore the shape of the reflecting side walls, the proposed extraction device makes it possible to spatially select the wavelengths of the light emitted by the diode and to improve or modify the emission colour purity of this diode, like the device based on lenses and stops described in the aforementioned document US 2004-051447, advantageously avoiding the constraints of positioning the components of this lens-based device.

The definition of the shape of the reflecting side walls includes that of the depth of the extractors, that is to say the distance between the entry section and the exit section. It also includes the shape and the area of these sections, the edges of which define these walls. Thus, if it is desired to exclude a high proportion of the rays emitted by the electroluminescent layer whenever these rays have a wavelength excluded from an interval $[\lambda_{CN}, \lambda_{C\text{-}lim}]$, where $\lambda_{C\text{-}lim}$ is a cut-off wavelength chosen to be less than $\lambda_{CN}$, the geometry of the extractors is determined in such a way that said cut-off angle $\theta_{lim}$ corresponds to this cut-off wavelength $\lambda_{C\text{-}lim}$.

Preferably, in a first variant, said reflecting side walls of the at least one extractor are formed by the interface between two transparent materials having different optical indices and the shape of these walls and the difference between these optical indices are adapted so that the emitted light rays that strike said walls coming from the inside of said extractor and from its entry section are reflected by total internal reflection off said walls. These conditions are opposite those described in document US2004-150329, in which these rays are on the contrary refracted and transmitted by this interface.

According to a second variant, said reflecting side walls are preferably metallized. Any emitted light ray that strikes said walls coming from the interior of said extractor is then reflected off said walls.

Preferably, said reflecting side walls of the extractor are pair-wise symmetrical with respect to a plane oriented in a direction normal to said lower reflecting layer and to said upper reflecting layer. In the case of the above-mentioned extractor, which is common to all the diodes of any one row or of any one column of a diode-based display, this extractor then comprises two opposed reflecting side walls that are symmetrical with respect to a plane parallel to said row or to said column. In the case of entry and exit sections that are rectangular or square, in general there is a first pair of opposed side walls that are symmetrical with respect to a first plane and there is a second pair of opposed side walls that are symmetrical with respect to a second plane, perpendicular to the first.

Preferably, said reflecting side walls have an axis of symmetry oriented in a direction normal to said lower reflecting layer and to said upper reflecting layer.

Preferably, each of the two lines of intersection of said side walls with any section plane of this wall, which plane is oriented in a direction that is normal to said lower reflecting layer and to said upper reflecting layer and is perpendicular to said plane of symmetry, or with any section plane passing through said axis of symmetry, forms a straight line or a parabola, the axis of which is in said normal direction. Advantageously, such shapes make it possible to obtain both the concentration effect, since the exit section has a smaller area than the entry section, and the spatial selection of the wavelengths of the light emitted by the diode, since such extractors have a cut-off angle as defined above. In the case of walls having an axis of symmetry, these reflecting side walls then form a cone or a paraboloid.

Preferably, each of the two lines of intersection of said side walls with any section plane of this wall, which plane is oriented in a direction that is normal to said lower reflecting layer and to said upper reflecting layer and is perpendicular to said plane of symmetry, or with any section plane passing through said axis of symmetry, lies within the surface bounded by:
  on the one hand, a straight line joining the point common to said line of intersection and to said entry section and the point common to said line of intersection and to said exit section; and
  on the other hand, a parabola, the axis of which is approximately parallel to the straight line joining the latter common point and the point common to the other line of intersection, which is symmetrical with the previous one, and to said entry section, and the focus of which coincides approximately with the point common to this other line of intersection and to the edge of said exit section.

The parabolas thus defined are termed "CPC (compound parabolic concentrator) parabolas". Included within this surface here are the contours of this surface.

Preferably, each of the two lines of intersection of said side walls with the section plane coincide approximately with this CPC parabola. It should be pointed out that the normal to each CPC-type parabola in said section plane, at the common point E, E' of this parabola and of the edge of the entry section of said extractor, is perpendicular to said plane of symmetry or to said axis of symmetry.

The side walls then form a CPC, thereby allowing the concentration efficiency to be optimized while broadening the angular distribution of the emission from the diode, unlike the device based on lenses and stops described in document US 2004-051447. Moreover, the cut-off angle then corresponds to the angle between what is called the "extreme ray" of this extractor and the normal direction. This extreme ray lies within said section plane and is defined as the ray that passes, on the one hand, through the point common to the edge of the entry section of the extractor and of a first line of intersection of the reflecting side walls of this extractor with this section plane and, on the other hand, through the point common to the edge of the exit section and of a second line of intersection of the walls with this section plane, which is symmetrical with the first with respect to said plane of symmetry or to said axis of symmetry.

The work entitled "*High Collection Nonimaging Optics*", by W. T. Welford & R. Winston, Academic Press, Inc., 1989 precisely defines the shape of the side walls of a CPC-type extractor, and also its depth and the ratio of the areas of the entry and exit sections—see in particular paragraph 3 of chapter 4 of this work. Document U.S. Pat. No. 6,603,243 illustrates an application for limiting the viewing angle of light-emitting diode displays without resonant cavities. If $2a'$ is the distance between two opposed edges of the exit section of an extractor of this CPC type in the section plane defined above, if $2a$ is the distance between two opposed edges of the entry section, again in this section plane, and if $\theta_C$ is the cut-off angle, then these three parameters are related through the equation: $a=a'/\sin\theta_C$. The depth L of the extractor, that is to say the distance between the entry section and the exit section, is expressed by the equation: $L=(a+a')\cos\theta_C$.

Thus, if for example $\theta_{lim}=25°$ C. (see FIG. 4), then $a'=0.42a$ and $L=1.42a$, and a significant colour purification effect is obtained (see FIG. 3—cut-off appearing at about 600 nm). Thus, if the width of the emission surface of a diode is 200 μm, which corresponds, by optical coupling, to the width of the entry section of a CPC extractor ($a=100$ μm, and therefore $a'=42$ μm), then $L=129$ μm.

Preferably, the diode comprises a plurality of extractors. These extractors are then preferably juxtaposed so that their entry sections cover the entire emissive surface of the diode.

The space lying between the exit sections of the extractors of the diode is advantageously made opaque and non-reflective, thus forming a "black matrix", thereby improving the emission contrast of the diode in ambient light. The higher the concentration ratio of the extractor, the greater the available area for this "black matrix" and the better the emission contrast in ambient light.

The subject of the invention is also an image display comprising a plurality of diodes according to the invention, which are distributed on one and the same substrate.

Preferably, each diode comprises a plurality of extractors. This makes it possible to obviate alignment constraints between each of the extractors and each of the diodes, and thereby allowing the depth of these extractors to be reduced.

Preferably, these extractors are formed in one and the same layer of transparent material that covers the entire display. This layer is called the "extraction layer".

According to a first variant, this extraction layer is placed opposite the substrate relative to the electroluminescent layer and also serves as encapsulation layer for protecting the electroluminescent layer from the risks of degradation.

According to a second variant, this extraction layer serves as substrate.

Preferably, the diodes of the display are distributed in rows and columns and each extractor is common to several diodes of any one column.

Preferably, each extractor is common to all the diodes of any one column.

Preferably, when said columns are arranged vertically so as to be adapted to the image display, said reflecting side walls of each extractor common to several diodes of any one column are pair-wise symmetrical with respect to a plane that is oriented in said normal direction and is parallel to said column.

Thus, when these reflecting side walls have a suitable shape so that the emitted light rays that penetrate via the entry section of this extractor and are reflected at least once off said side walls, emerge from this extractor via its exit section at an angle of emission greater than the angle of emission of these rays at the entry of the extractor, the horizontal emission distribution of the display is advantageously broadened, that is to say the horizontal viewing angle of the display is advantageously broadened.

The invention will be more clearly understood on reading the following description, given by way of non-limiting example and with reference to the appended figures in which:

FIG. 1, already described, shows the distribution of the emission intensity of two diodes of the prior art as a function of the viewing angle;

FIG. 2, already described, corresponds to FIG. 7 of document US 2004-051447 and shows, as a function of the observation angle (viewing angle), the wavelength of the emission maximum of a diode of the prior art, which is provided with a resonant optical cavity that resonates at about 550 nm in a normal direction;

FIG. 3, already described, gives the intrinsic electroluminescent spectrum of an organic material of the prior art, emitting in the red;

FIG. 4, already described, shows, for three different wavelengths, the distribution, as a function of the viewing angle, of the emission intensity of a diode of the prior art that includes an electroluminescent layer made of material of FIG. 3 and an optical cavity that resonates in the normal direction at a wavelength of 650 nm;

in FIG. 8, the extractors are conical with a square cross section and in FIG. 9 each extractor is common to a column of diodes;

Figure 14:
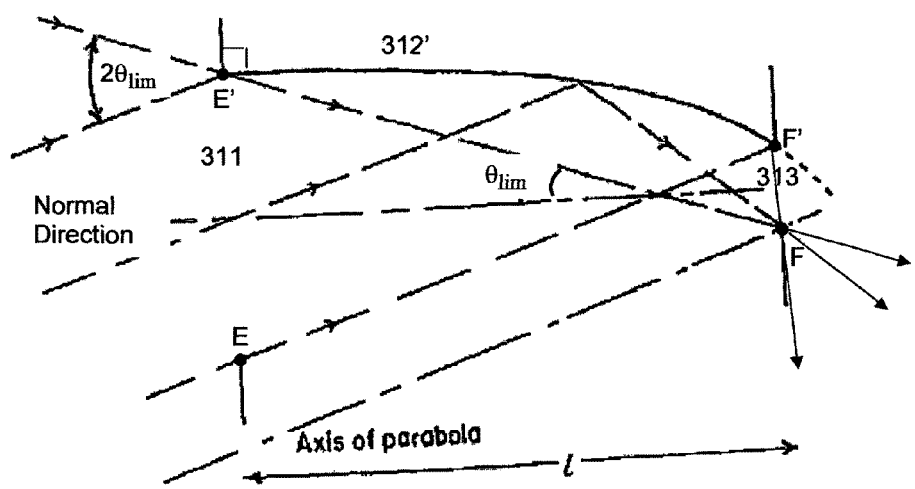

FIGS. 10 to 13 illustrate variants of the shape of the intersections of a normal section plane with the side walls of an extractor for diodes according to the invention: CPC shape in FIGS. 10 and 11; a truncated CPC shape in FIG. 12; and a trapezoidal shape lying within a CPC shape in FIG. 13; and FIG. 14 illustrates the ray tracing for a CPC-type parabola between an entry section and an exit section of an extractor according to the variant shown in FIGS. 10 and 11.

To simplify the description and bring out the differences and advantages that the invention provides over the prior art, identical references are used for the components that provide the same functions.

One embodiment of the invention will now be described with reference to FIGS. 5 to 8 in the case of an image display comprising a plurality of diodes 2 distributed in rows and columns and placed on one and the same substrate 1. Referring to FIG. 6, each diode 2 comprises a thick metal lower electrode 21, forming a reflecting layer, an organic electroluminescent layer 22, and a semi-transparent upper electrode 23, also forming a semi-reflecting layer. The organic electroluminescent layer 22 comprises, in a conventional manner, a sublayer 222 for the injection and transport of carriers of a first kind, a sublayer 223 for blocking the carriers of a second kind, a sublayer 221 which is the actual electroluminescent part, a sublayer 224 for blocking the carriers of the first kind, and a sublayer 225 for the injection and transport of carriers of the second kind. The kinds of carriers correspond to electrons and to holes. The upper electrode 23 comprises, for example, a thin metal sublayer, for example made of silver, and a thicker dielectric sublayer, suitable for giving the stack of these sublayers the required optical properties.

The space between the two electrodes 21 and 23 forms a resonant optical cavity. The distance $D_c$ between these two electrodes 21 and 23, which corresponds to the height of this cavity, is suitable, as explained above, for obtaining resonance of the light rays of wavelength % CN that are emitted by the layer 22 in a direction normal to these electrodes. Preferably, $2\pi \times 2D_c/\lambda_{CN} + F = 2\pi$, where F denotes the overall phase change upon reflection of a ray of wavelength $\lambda_{CN}$ on each of the electrodes 21, 23.

Figure 1:
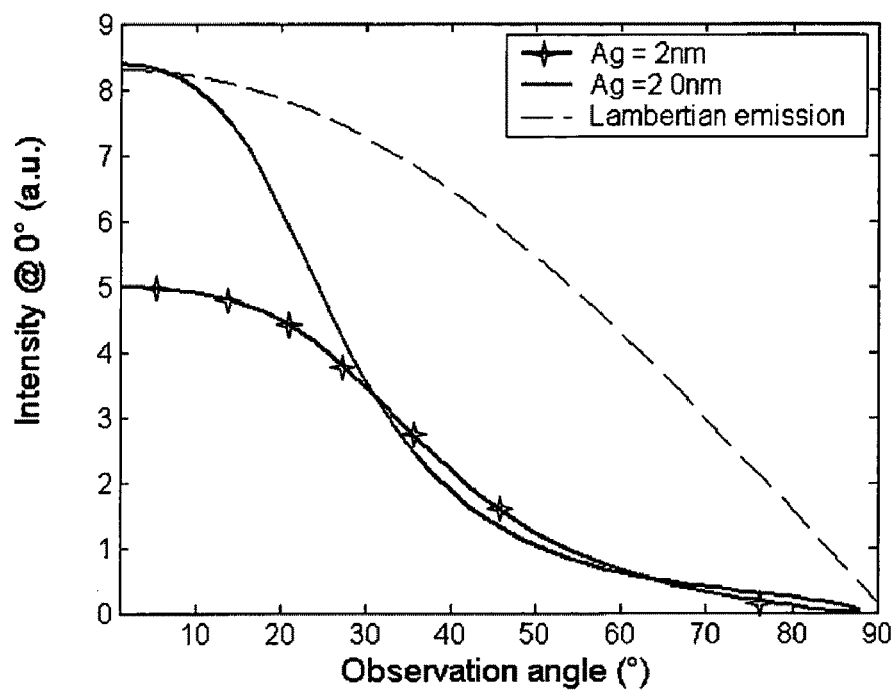
Figure 2:
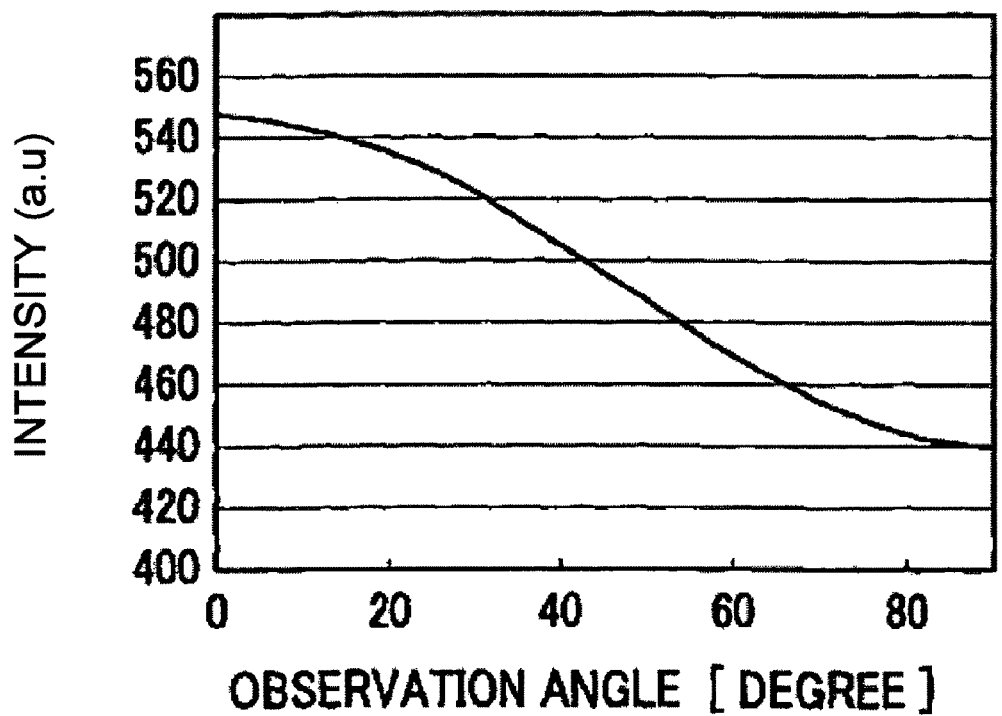
Figure 3:
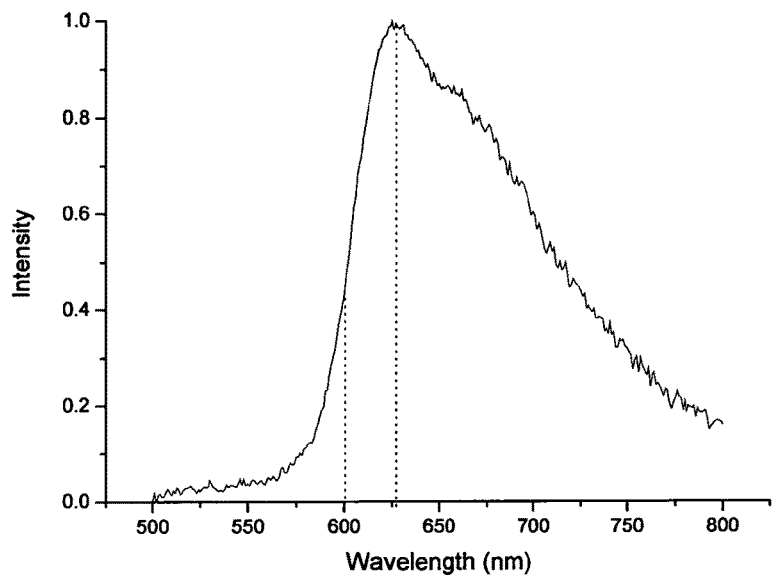
Figure 4:
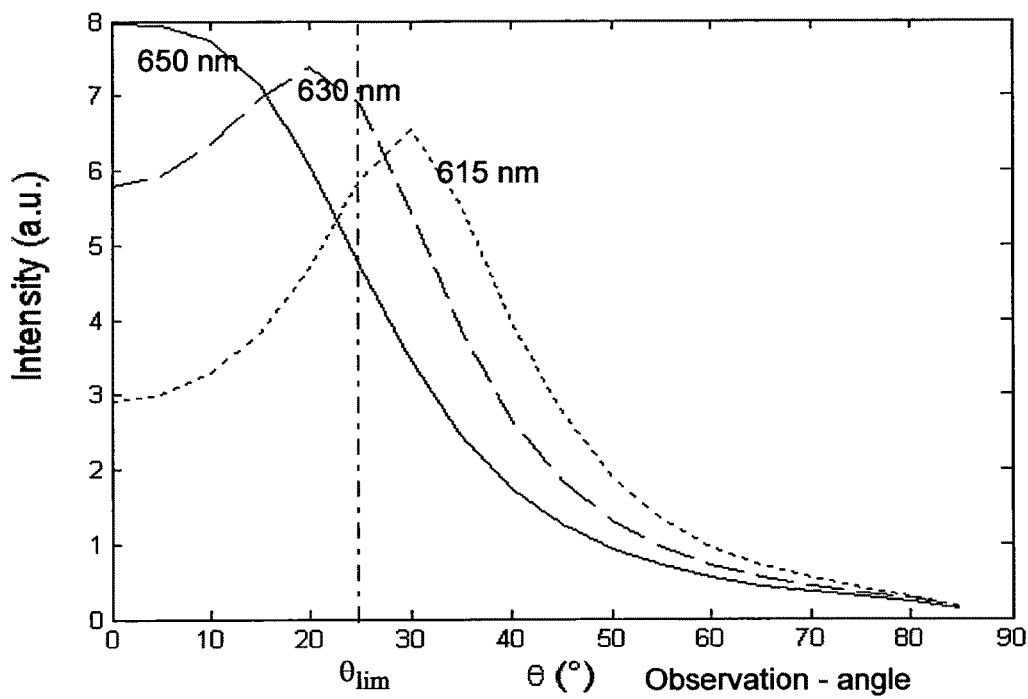
Figure 5:
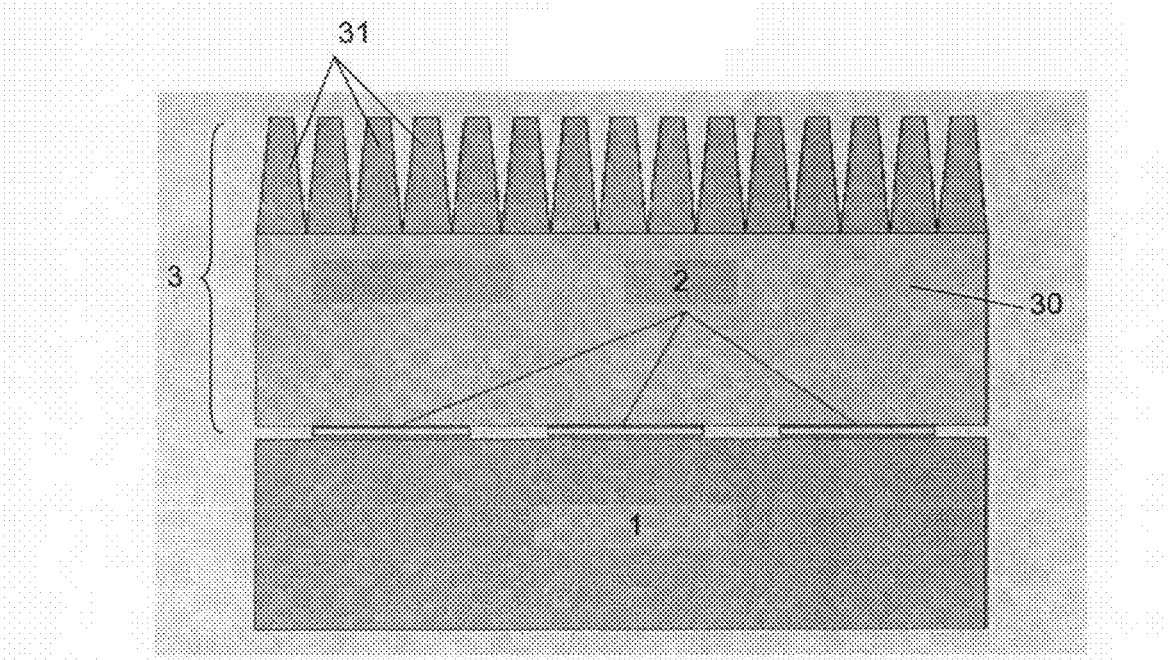
FIG. 5 is a sectional view of a diode-based display according to a first embodiment of the invention.
Figure 6:
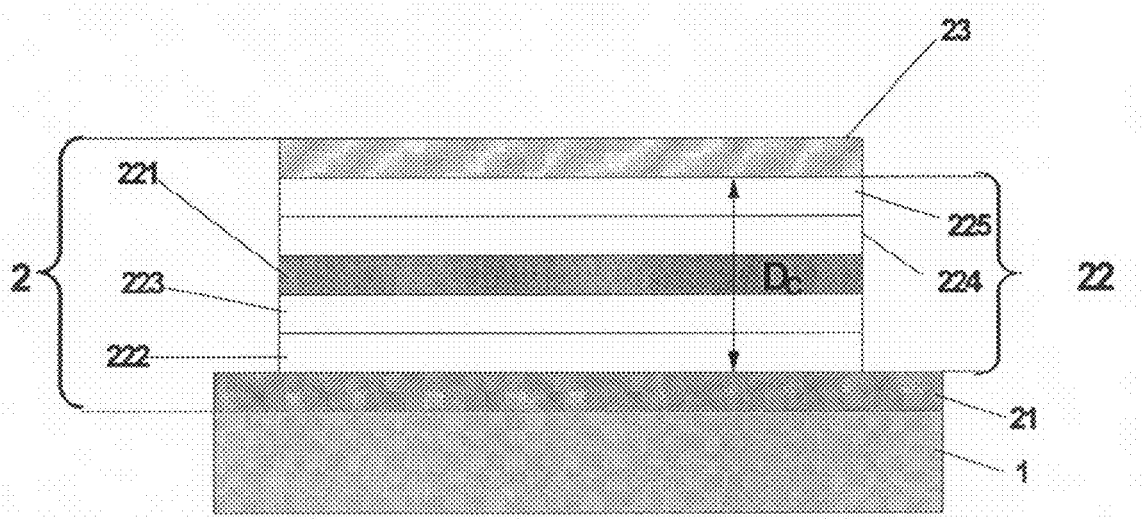
FIG. 6 is a detailed sectional view of one diode of the display of FIG. 5.
Figure 7:
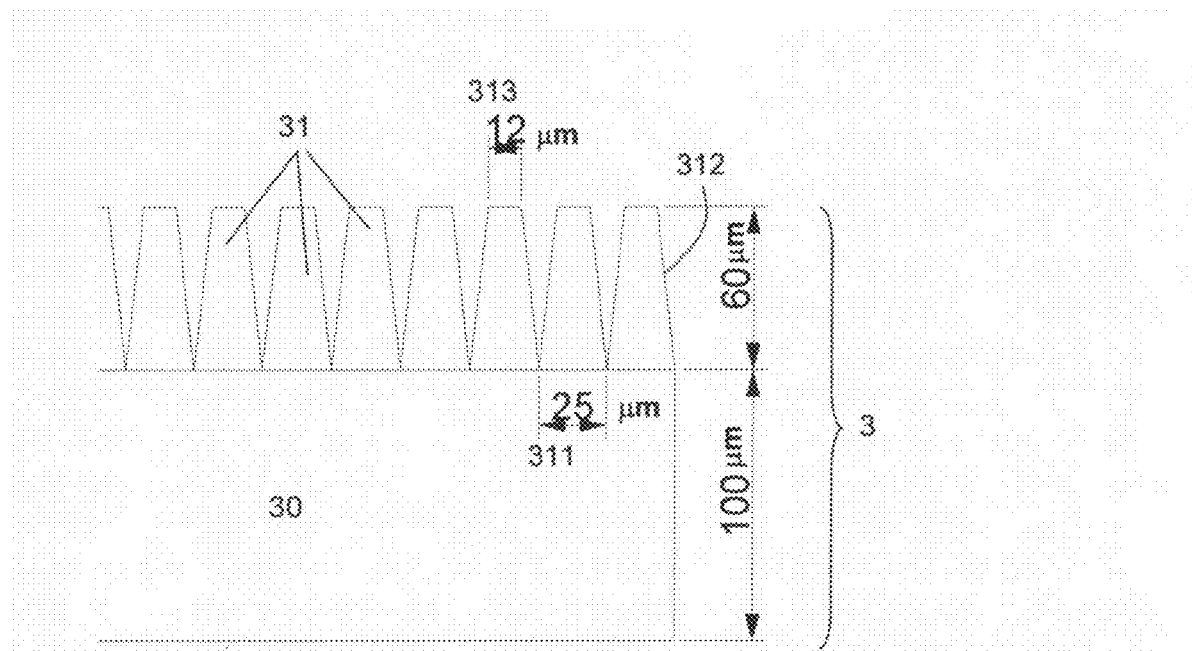
FIG. 7 is a detailed sectional view of the extractors of the display of FIG. 5.
Figure 8:
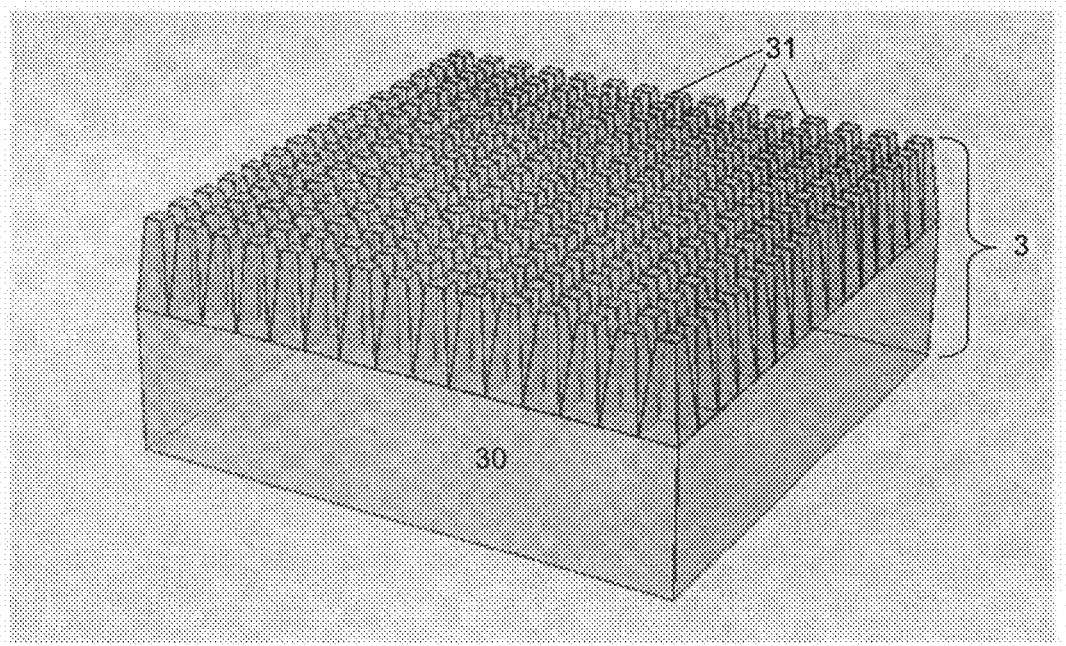
FIGS. 8 and 9 illustrate two variants of the display of FIG. 5.

Referring to FIG. 5, the emissive surface of the diodes 2, which emit through their upper electrode 23, is covered with an extraction/encapsulation layer 3. This layer 3 comprises a transparent base 30 and an array of extractors 31 covering this base. Referring to FIG. 7, each extractor 31 has a square entry section 311 and an exit section 313, also square, having a smaller area than that of the entry section. Each extractor 31 also includes reflecting side walls 312, which here are plane and the contours of which are therefore trapezoidal. Referring to FIG. 8, each extractor 31 therefore forms a truncated cone of square section, which therefore has two perpendicular planes of symmetry that are oriented in a normal direction. Referring to FIG. 5, the emissive surface of each diode is optically coupled to the entry section of several extractors 31 via the transparent base 30, the area of each entry section 311 being significantly smaller, preferably by a factor of at least 10, than the emissive area of each diode. Referring to FIG. 7, the thickness of the base 30 of the layer 3 is for example 100 µm, the height of each extractor is for example 16 µm, the side on its entry section 311 is for example 25 µm and the side on its exit section 313 is for example 12 µm.

The entire layer 3 is for example formed by compression moulding in a sheet of transparent thermoformable polymer material, such as PMMA (polymethyl methacrylate). This layer 3 is joined to the substrate that supports the diodes, by means of a suitable adhesive for optically coupling the upper electrodes 23 of the diodes 2 to the base 30 of the layer 3. Since the entry sections 311 of the extractors 31 have a significantly smaller area than that of the emissive surface of the diodes, the assembly is advantageously produced without any alignment constraints.

What is obtained is a display whose viewing angle is, thanks to the shape of the extractors, broadened both in a horizontal plane and in a vertical plane.

Figure 9:
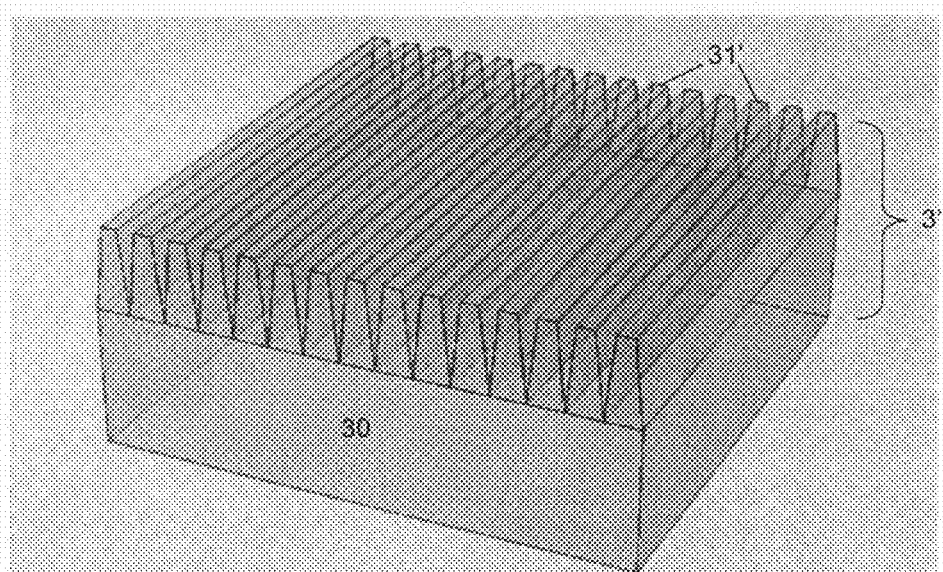

FIG. 9 shows an alternative embodiment of this display. Each extractor 31' is common to a plurality of diodes of any one column and possesses a single plane of symmetry oriented in a normal direction and parallel to this column. The components of FIG. 7 described above lie in any section plane perpendicular to this plane of symmetry and also oriented in a normal direction. What is obtained is a display whose viewing angle is, thanks to the shape of the extractors, in this case broadened only, and advantageously, in a horizontal plane.

Figures 10, 11:
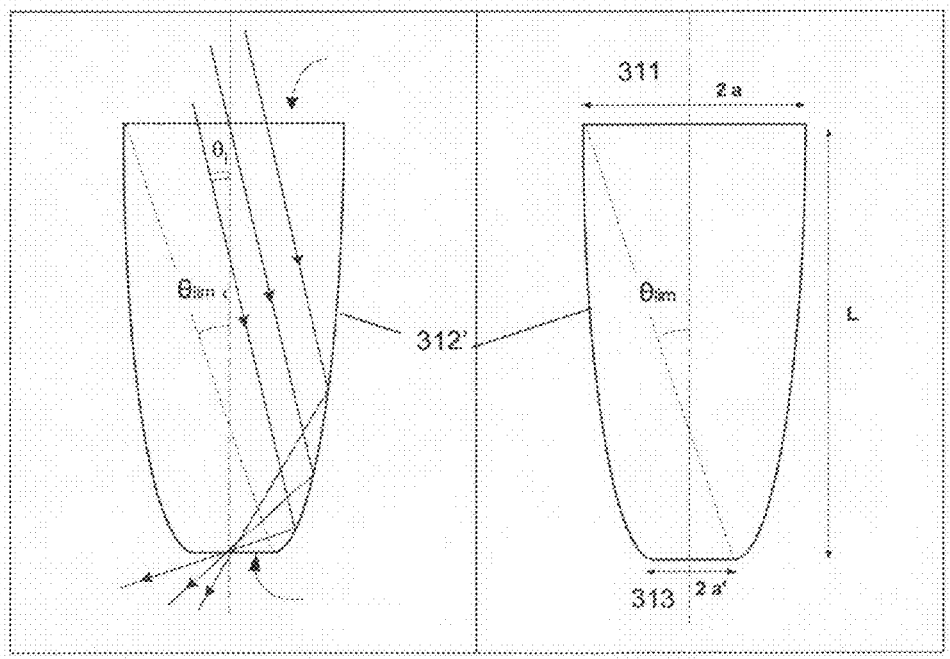

In a preferred alternative shown in FIGS. 10 and 11, the reflecting side walls of the extractors are of the CPC type. More precisely in this case, the intersection of the side walls 312' of each extractor 31 with a section plane perpendicular to any plane of symmetry of the extractor forms a CPC-type parabola. In the case of extractors having an axis of symmetry, this section plane then passes through this axis. FIG. 14 shows in detail the characteristics of the ray tracing for a CPC-type parabola, in which the points E and E' represent the edges of the entry section of the extractor and the points F and F' represent the edges of the exit section, in which the parabola that follows the line F'E' has the point F as focus and a straight line parallel to F'E passing through F as axis, and in which the parabola that follows the line FE has the point F' as focus and a straight line parallel to FE' passing through F' as axis.

One property of such CPC parabolas is that, in the section plane, the tangent to the point of each parabola that lies at its intersection with the entry section, here at the points E and E', is parallel to the normal direction, and therefore here perpendicular to the planes of the entry and exit sections.

The advantage of the CPC parabola shape of this section of the extractor is that it optimizes the concentration of the rays that are emitted by the diode at an angle of emission at or below the cut-off angle $\theta_{lim}$. This cut-off angle therefore corresponds to the angle between what are called the "extreme rays" of this extractor, here FE' and F'E, for the first and second CPC parabolas respectively, and the direction normal to the plane of the diode.

Advantageously, thanks to this CPC-type shape of the extractors of the display according to the invention, the rays emitted by the diode in the section plane of the extractor with an angle of emission not exceeding this cut-off angle $\theta_{lim}$ are redistributed at the exit of these extractors over a much wider solid angle, as illustrated in FIGS. 10 and 14. The broadening of the emission solid angle obviously occurs in the section plane where the intersection of the side walls of the extractor with this plane forms parabolas of the CPC type. Thus, using CPC extractors having several planes of symmetry, or even an axis of symmetry, and therefore with an extraction layer similar to that shown in FIG. 8, the emission solid angle of the diodes of the display is broadened in all directions, as is, of course, its solid viewing angle. Conversely, using CPC extractors having only a single plane of symmetry, and therefore with an extraction layer similar to that shown in FIG. 9, the solid emission angle of the diodes of the display is broadened mainly in a plane perpendicular to this plane of symmetry, as is, of course, its solid viewing angle.

Advantageously, thanks to this CPC-type shape of the extractors of the display according to the invention, the rays emitted by the diode outside the solid angle limited, in the section plane of the extractor, by the cut-off angle $\theta_{lim}$ are sent back by reflection to the diode and therefore are excluded from the emission solid angle at the exit of the extractor.

If $\lambda_{CN}$ is the resonant wavelength of the light rays emitted by the electroluminescent layer of the diode in a normal direction (in which case $2\pi \times 2D_C/\lambda_{CN} + F = 2\pi$—cf. above), the wavelength $\lambda_{C\text{-}lim}$ of the light rays that have an emission maximum at the emission angle $\theta_{lim}$ equal to the cut-off angle is given by $\lambda_{C\text{-}lim} = \lambda_{CN} \times \cos\theta_{lim}$, at least if the overall phase change F on each of the electrodes 21, 23 is substantially independent of the wavelength.

Thus, if it is desired to exclude a high proportion of the rays emitted by the electroluminescent layer 22 whenever these rays have a wavelength excluded from an interval $[\lambda_{CN}, \lambda_{C\text{-}lim}]$, where $\lambda_{C\text{-}lim}$ is a cut-off wavelength of less than $\lambda_{CN}$, the geometry of the extractors is determined so that the cut-off angle $\theta_{lim}$ corresponds to this cut-off wavelength $\lambda_{C\text{-}lim}$, more precisely here so that $\lambda_{C\text{-}lim} = \lambda_{CN} \cos\theta_{lim}$. It may therefore be seen that the extractors also have, in combination with the optical cavities, a spatial filtering function for colours, allowing the purity of the colour emitted by the diodes to be improved or adjusted.

It may therefore be seen that the extractors of CPC shape make it possible both to broaden the viewing angle of the display, thereby correcting the defects inherent in optical cavities, and to improve the purity of the colours emitted.

Figures 12, 13:
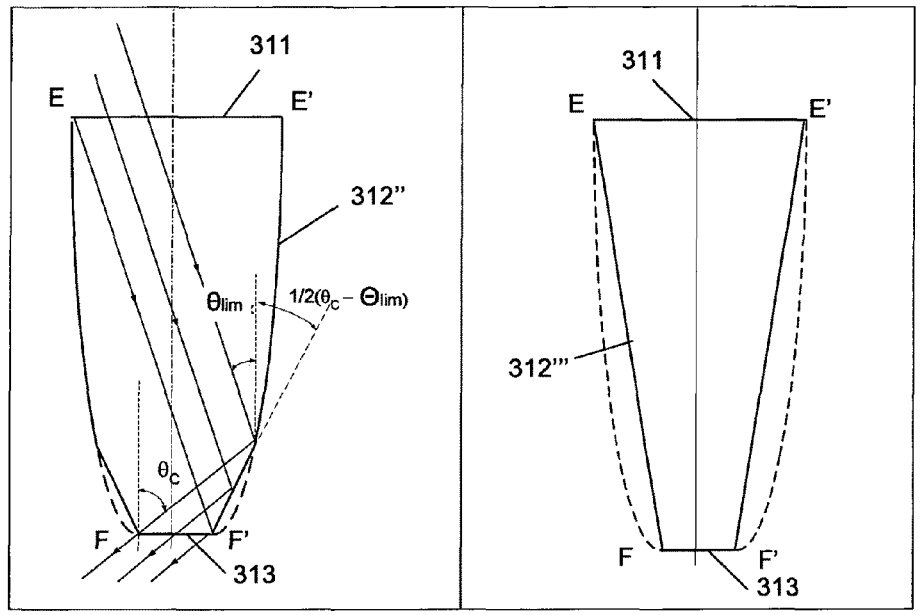

According to other variants, such as that shown in FIG. 12, the reflecting side walls of the extractors have a shape intermediate between the plane shape 312''' shown in FIG. 13 and the CPC shape described above and shown in FIGS. 10, 11 and 14. More precisely in this case, the intersection of the side walls 312'' of each extractor 31 with a section plane perpendicular to any plane of symmetry of the extractor (or any plane passing through its axis of symmetry) lies within the surface bounded by the straight line EF and the CPC parabola passing through the points E and F, and within the surface bounded by the straight line E'F' and the CPC parabola passing through the points E' and F'. These boundaries—straight lines and parabolas—lie within these surfaces. Advantageously, such "intermediate" shapes are simpler to manufacture than CPC shapes, while still providing performance levels that are very acceptable from the standpoint of the broadening of the viewing angles and of the spatial colour filtering.

The present invention has been described with reference to an organic light-emitting diode display for displaying images, but it is obvious to a person skilled in the art that the invention may apply to inorganic light-emitting diode displays, to diode-based illumination panels or to individual, organic or inorganic, diodes, without departing from the scope of the claims hereinbelow.

The invention claimed is:

1. A diode comprising an organic electroluminescent layer inserted between a lower electrode and an upper electrode, and between a lower reflecting layer and an upper reflecting layer, forming between them a resonant optical cavity for a range of wavelengths of light rays that can be emitted by said electroluminescent layer, wherein $\lambda_{CN}$ is included in said range of wavelengths and is defined as the resonant wavelength of the light rays emitted by the electroluminescent layer in the normal direction within said resonant optical cavity, said normal direction being defined as being normal to said lower reflecting layer and to said upper reflecting layer, wherein at least one of the electrodes and the reflecting layer located on the same side as this electrode relative to said electroluminescent layer is transparent or semi-transparent to said emitted light rays, wherein said diode includes at least one light extractor comprising a light entry section, optically coupled to said electroluminescent layer via said electrode and said reflecting layer that are transparent or semi-transparent, a light exit section, which is oriented towards the outside of the diode and has a smaller area than that of the entry section, and reflecting side walls, which are bounded by said entry section and by said exit section, and wherein, in order to limit the range of wavelengths of light rays exiting said diode to an upper limit $\lambda_{C\text{-}lim}$, i.e. in order to exclude a high proportion of the light rays emitted by the electroluminescent layer as far as their wavelength is out of an interval that is defined to be narrower than said range of wavelengths of light rays that can be emitted by the electroluminescent layer and that exit from the resonant optical cavity, the reflecting side walls of the at least one extractor have a suitable shape so that there is an angle called the cut-off angle $\theta_{lim}$ defined by the equation $\cos\theta_{lim}/\lambda_{CN}$ such that:

the emitted light rays, which penetrate via its entry section at an angle of emission not exceeding said cut-off angle $\theta_{lim}$, emerge from this extractor via its exit section, said angle of emission being measured relative to said normal direction; and the emitted light rays, that penetrate via its entry section at an angle of emission greater than this cut-off angle $\theta_{lim}$, do not emerge from the extractor via its exit section, and wherein $\lambda_{C\text{-}lim}$ corresponds to the wavelength of the light rays that have an emission maximum at the emission angle equal to said cut-off angle $\theta_{lim}$.

2. The diode according to claim 1, wherein the reflecting side walls of the at least one extractor have a suitable shape so that any emitted light ray that penetrates via its entry section, which is reflected at least once by said side walls, and which emerges from the extractor via its exit section, emerges therefrom at an angle of emission greater than the angle of emission of this ray at the entry of the extractor.

3. The diode according to claim 1, wherein said reflecting side walls of the at least one extractor are formed by the interface between two transparent materials having different optical indices and in that the shape of these walls and the difference between these optical indices are adapted so that the emitted light rays that strike said walls coming from the inside of said extractor and from its entry section are reflected by total internal reflection off said walls.

4. The diode according to claim 1, wherein said reflecting side walls are metallized.

5. The diode according to claim 1, wherein said reflecting side walls of the extractor are pair-wise symmetrical with respect to a plane oriented in a direction normal to said lower reflecting layer and to said upper reflecting layer.

6. The diode according to claim 1, wherein said reflecting side walls have an axis of symmetry oriented in a direction normal to said lower reflecting layer and to said upper reflecting layer.

7. The diode according to claim 5, wherein each of the two lines of intersection of said side walls with any section plane of this wall, which plane is oriented in a direction that is normal to said lower reflecting layer and to said upper reflecting layer and is perpendicular to said plane of symmetry, or with any section plane passing through said axis of symmetry, forms a straight line or a parabola, the axis of which is in said normal direction.

8. The diode according to claim 5, wherein each of the two lines of intersection of said side walls with any section plane of this wall, which plane is oriented in a direction that is normal to said lower reflecting layer and to said upper reflecting layer and is perpendicular to said plane of symmetry, or with any section plane passing through said axis of symmetry, lies within the surface bounded by:

on the one hand, a straight line joining the point (E'; E) common to said line of intersection and to said entry section and the point (F'; F) common to said line of intersection and to said exit section; and on the other hand, a parabola, the axis of which is approximately parallel to the straight line joining the latter common point (F'; F) and the point (E; E') common to the other line of intersection, which is symmetrical with the previous one, and to said entry section, and the focus of which coincides approximately with the point (F; F') common to this other line of intersection and to the edge of said exit section.

9. The diode according to claim 1, wherein the diode includes a plurality of said extractors.

10. An image display comprising a plurality of diodes according to claim 1, wherein said diodes are distributed on one and the same substrate.

11. The image display according to claim 10, wherein said diodes are distributed in rows and columns and in that each extractor is common to several diodes of any one column.

12. The image display according to claim 11, wherein, when said columns are arranged vertically so as to be adapted to the image display, said reflecting side walls of each extractor common to several diodes of any one column are pair-wise symmetrical with respect to a plane that is oriented in said normal direction and is parallel to said column.

* * * * *